(12) United States Patent
Hojo et al.

(10) Patent No.: US 7,727,701 B2
(45) Date of Patent: Jun. 1, 2010

(54) POSITIVE RESIST COMPOSITION AND METHOD OF FORMING RESIST PATTERN

(75) Inventors: Takuma Hojo, Kawasaki (JP); Kiyoshi Ishikawa, Kawasaki (JP); Tomoyuki Ando, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 312 days.

(21) Appl. No.: 10/586,694

(22) PCT Filed: Jan. 14, 2005

(86) PCT No.: PCT/JP2005/000351
§ 371 (c)(1), (2), (4) Date: Jan. 24, 2008

(87) PCT Pub. No.: WO2005/071490
PCT Pub. Date: Aug. 4, 2005

(65) Prior Publication Data
US 2008/0241747 A1    Oct. 2, 2008

(30) Foreign Application Priority Data

Jan. 23, 2004 (JP) .............................. 2004-015716
Dec. 3, 2004 (JP) .............................. 2004-351701

(51) Int. Cl.
G03F 7/039 (2006.01)
G03F 7/20 (2006.01)
G03F 7/30 (2006.01)
G03F 7/38 (2006.01)

(52) U.S. Cl. .................... 430/270.1; 430/326; 430/330; 430/905; 430/921; 430/925

(58) Field of Classification Search .............. 430/270.1, 430/286.1, 326; 522/31
See application file for complete search history.

(56) References Cited

U.S. PATENT DOCUMENTS

| | | | |
|---|---|---|---|
| 5,352,564 A * | 10/1994 | Takeda et al. ............ | 430/270.1 |
| 6,133,412 A | 10/2000 | Malik et al. | |
| 6,207,343 B1 | 3/2001 | Fujimori et al. | |
| 6,649,322 B2 | 11/2003 | Kumon et al. | |
| 6,756,179 B2 * | 6/2004 | Fujimori et al. .......... | 430/270.1 |
| 2003/0232273 A1 | 12/2003 | Adams et al. | |

FOREIGN PATENT DOCUMENTS

| | | | |
|---|---|---|---|
| JP | 11002902 A * | 1/1999 | |
| JP | 2002-169295 | 6/2002 | |
| JP | 2002-341538 | 11/2002 | |
| JP | 2002341538 A * | 11/2002 | |
| JP | 2003-307840 | 10/2003 | |
| TW | 573226 | 1/2004 | |
| WO | WO 2004/097524 A1 | 11/2004 | |

OTHER PUBLICATIONS

Malik, Sanjay, Blakeney, A., Ferreira, B.M, et al. Lithographic Properties of Novel Acetal-Derivatized Hydroxy Styrene Polymers. SPIE vol. 3678, pp. 388-400. Mar. 1999.*
Machine-assisted English translation of JP 2002-341538 (Sasaki et al) provided by JPO.*
Machine-assisted English translation for JP2003-307840 (Momota et al) provided by JPO).*
JPO English abstract for JP2003-307840 (Momota et al).*
Office Action and Search Report issued on May 13, 2008, on the counterpart Taiwanese Patent Application No. 094101312.
Hojo et al. *Journal of Photopolymer Science and Technology.* 16(3):455-458 (2003).
European Search Report issued in corresponding European Patent Application No. 05703590.9, dated Dec. 11, 2009.

* cited by examiner

*Primary Examiner*—Sin J. Lee
(74) *Attorney, Agent, or Firm*—Knobbe, Martens, Olson & Bear, LLP

(57) ABSTRACT

A positive resist composition that exhibits a large exposure margin, and excellent levels of resolution and dry etching resistance, as well as a method of forming a resist pattern that uses the positive resist composition. This resist composition includes a resin component (A), which contains acid dissociable, dissolution inhibiting groups and displays increased alkali solubility under the action of acid, and an acid generator component (B) that generates acid on exposure, wherein the resin component (A) contains a structural unit (a1) represented by a general formula (I) shown below, a structural unit (a2) in which a hydroxyl group within the above general formula (I) has been protected by substituting the hydrogen atom thereof with an acid dissociable, dissolution inhibiting group (II) represented by a general formula (II) shown below, and a structural unit (a3) in which a hydroxyl group within the above general formula (I) has been protected by substituting the hydrogen atom thereof with an acyclic acid dissociable, dissolution inhibiting group (III).

[Formula 1]

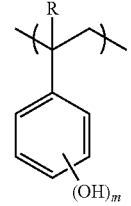

(I)

[Formula 2]

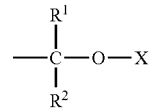

(II)

14 Claims, No Drawings

POSITIVE RESIST COMPOSITION AND METHOD OF FORMING RESIST PATTERN

CROSS-REFERENCE TO RELATED APPLICATIONS

This application is the U.S. National Phase filing under 35 U.S.C. §371 of PCT/JP2005/000351, filed Jan. 14, 2005, which designated the United States and was published in a language other than English, which claims priority under 35 U.S.C. §119(a)-(d) to Japanese Patent Application Nos. 2004-015716, filed Jan. 23, 2004, and 2004-351701, filed Dec. 3, 2004. The content of these applications is incorporated herein by reference in their entireties.

TECHNICAL FIELD

The present invention relates to a positive resist composition and a method of forming a resist pattern.

BACKGROUND ART

In recent years, advances in lithography techniques have lead to ongoing, rapid miniaturization of resist patterns. Recently, levels of resolution capable of forming line and space patterns of no more than 100 nm and isolated patterns of no more than 70 nm are being demanded.

In the microprocessing technology used for realizing these high levels of resolution, positive resist compositions that have been proposed as ideal resist materials, particularly for use in methods that include an exposure step using an electron beam, typically employ a polyhydroxystyrene-based resin in which a portion of the hydroxyl groups have been protected with acid dissociable, dissolution inhibiting groups as the base resin. Examples of the most commonly used acid dissociable, dissolution inhibiting groups include so-called acetal groups, such as chain-like ether groups typified by 1-ethoxyethyl groups, and cyclic ether groups typified by tetrahydropyranyl groups, as well as tertiary alkyl groups typified by tert-butyl groups, and tertiary alkoxycarbonyl groups typified by tert-butoxycarbonyl groups (for example, see patent reference 1).

However, in conventional microprocessing technology, the formation of fine patterns with high aspect ratios, and particularly line and space patterns of no more than 100 nm, has proven very difficult due to problems such as pattern collapse caused by the surface tension of the developing solution.

One possible countermeasure for such pattern collapse involves reducing the thickness of the resist film. However, thin films produced using conventional resist compositions suffer from inadequate dry etching resistance.

In relation to this problem, the inventors of the present invention have reported, in non-patent reference 1, that a resist composition including, as a base resin, a copolymer of hydroxystyrene and styrene that has been protected with adamantoxyethyl groups is capable of forming a thin film, exhibits favorable dry etching resistance, and is ideal as a resist material for a method that includes an exposure step using an electron beam.

[Patent Reference 1]

Japanese Unexamined Patent Application, First Publication No. 2002-341538

[Non-Patent Reference 1]

Hojo et al., Journal of Photopolymer Science and Technology, Vol. 16, No. 3, pp. 455 to 458, published Jun. 24, 2003)

DISCLOSURE OF INVENTION

Problems to be Solved by the Invention

However, although the resist composition disclosed in the non-patent reference 1 exhibits the superior properties described above, the exposure margin is low, meaning a small deviation in the exposure dose causes a significant change in the dimensions of the formed resist pattern. In addition, further improvements in the resolution and dry etching resistance continue to be sought.

The present invention takes the above circumstances into consideration, with an object of providing a positive resist composition that exhibits a large exposure margin, and excellent levels of resolution and dry etching resistance, as well as a method of forming a resist pattern that uses the positive resist composition.

Means for Solving the Problems

As a result of intensive investigation, the inventors of the present invention discovered that the above object could be achieved by using a positive resist composition that includes, as a base resin, a resin having three specific structural units, and they were thus able to complete the present invention.

In other words, a first aspect of the present invention provides a positive resist composition that includes a resin component (A), which contains acid dissociable, dissolution inhibiting groups and displays increased alkali solubility under the action of acid, and an acid generator component (B) that generates acid on exposure, wherein the resin component (A) contains a structural unit (a1) represented by a general formula (I) shown below:

[Formula 1]

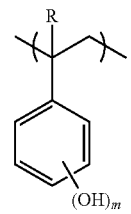

(I)

(wherein, R represents a hydrogen atom or methyl group, and m represents an integer from 1 to 3), a structural unit (a2) in which a hydroxyl group within the above general formula (I) has been protected by substituting the hydrogen atom thereof with an acid dissociable, dissolution inhibiting group (II) represented by a general formula (II) shown below:

[Formula 2]

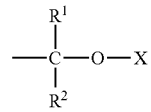

(II)

(wherein, $R^1$ represents an alkyl group of 1 to 5 carbon atoms, $R^2$ represents an alkyl group of 1 to 5 carbon atoms or a hydrogen atom, and X represents an aliphatic polycyclic group or an aromatic polycyclic hydrocarbon group), and a structural unit (a3) in which a hydroxyl group within the above general formula (I) has been protected by substituting the hydrogen atom thereof with an acyclic acid dissociable, dissolution inhibiting group (III).

Furthermore, a second aspect of the present invention provides a method of forming a resist pattern that includes the steps of applying the above positive resist composition to a substrate, conducting a prebake, performing selective exposure, conducting PEB (post exposure baking), and performing alkali developing to form the resist pattern.

In this description, the term "structural unit" refers to a monomer unit that contributes to the formation of a polymer.

Furthermore, the term "exposure" also includes irradiation with an electron beam.

EFFECTS OF THE INVENTION

The present invention provides a positive resist composition and a method of forming a resist pattern that exhibit a large exposure margin, and excellent levels of resolution and dry etching resistance.

BEST MODE FOR CARRYING OUT THE INVENTION

As follows is a more detailed description of the present invention.

A positive resist composition of the present invention includes a resin component (A) (hereafter also referred to as the "component (A)"), which contains acid dissociable, dissolution inhibiting groups and displays increased alkali solubility under the action of acid, and an acid generator component (B) (hereafter also referred to as the "component (B)") that generates acid on exposure.

In the component (A), the action of acid generated from the component (B) by exposure causes the acid dissociable, dissolution inhibiting groups to dissociate, causing the entire component (A) to change from an alkali-insoluble state to an alkali-soluble state.

As a result, when a resist is exposed during the formation of a resist pattern, either through a mask pattern or directly without using a mask pattern, or alternatively is exposed and then subjected to post exposure baking, the exposed portions of the resist shift to an alkali-soluble state, whereas the unexposed portions remain insoluble in alkali, meaning alkali developing can then be used to form a positive resist pattern.

[Component (A)]

The component (A) contains the structural units (a1) through (a3) as essential structural units.

<Structural Unit (a1)>

The structural unit (a1) is a structural unit represented by the general formula (I) shown above.

In the general formula (I), R is either a hydrogen atom or a methyl group, although a hydrogen atom is preferred. If R is a hydrogen atom, then the protection ratio for the hydroxyl groups can be improved, enabling the contrast to be improved. Furthermore, the rate of dissolution following developing can also be improved.

m is an integer from 1 to 3, and is preferably 1.

The bonding position of the hydroxyl group may be the opposition, the m-position, or the p-position, although from the viewpoints of ease of availability and cost, the p-position is preferred. Moreover, in those cases where m is either 2 or 3, any combination of substitution positions can be used.

<Structural Unit (a2)>

The structural unit (a2) is a structural unit in which a hydroxyl group within the above general formula (I) has been protected by substituting the hydrogen atom thereof with an acid dissociable, dissolution inhibiting group (II) represented by the general formula (II) shown above.

In the general formula (II), $R^1$ is a straight-chain or branched alkyl group of 1 to 5 carbon atoms, and suitable example include a methyl group, ethyl group, propyl group, isopropyl group, n-butyl group, isobutyl group, tert-butyl group, pentyl group, isopentyl group, or neopentyl group.

From an industrial viewpoint, a methyl group or ethyl group is preferred.

$R^2$ is a straight-chain or branched alkyl group of 1 to 5 carbon atoms or a hydrogen atom. Examples of suitable alkyl groups of 1 to 5 carbon atoms for $R^2$ include the same substituent groups described above for $R^1$. Of the above possibilities, from an industrial viewpoint, $R^2$ is preferably a hydrogen atom.

X is an aliphatic polycyclic group or an aromatic polycyclic hydrocarbon group, and is preferably an aliphatic polycyclic group of 10 to 16 carbon atoms, or an aromatic polycyclic hydrocarbon group of 10 to 16 carbon atoms. Of these groups, aliphatic polycyclic groups are preferred, as they produce superior levels of line edge roughness and cross-sectional rectangular formability for the resulting resist pattern.

Examples of aliphatic polycyclic groups of 10 to 16 carbon atoms include groups in which one hydrogen atom has been removed from a bicycloalkane, tricycloalkane or tetracycloalkane or the like. Specific examples include groups in which one hydrogen atom has been removed from a polycycloalkane such as adamantane, norbornane, isobornane, tricyclodecane or tetracyclododecane. These types of polycyclic groups can be appropriately selected from the multitude of groups proposed for use with conventional ArF resists. Of these groups, adamantyl groups, norbornyl groups, and tetracyclododecanyl groups are preferred industrially, and adamantyl groups are particularly desirable.

If X is an aliphatic polycyclic group, then a high level of resolution can be achieved, and the cross-sectional shape of the resist pattern adopts a favorable rectangular shape.

Examples of aromatic polycyclic hydrocarbon groups of 10 to 16 carbon atoms include groups in which one hydrogen atom has been removed from naphthalene, anthracene, phenanthrene or pyrene. Specific examples include a 1-naphthyl group, 2-naphthyl group, 1-anthracenyl group, 2-anthracenyl group, 1-phenanthryl group, 2-phenanthryl group, 3-phenanthryl group or 1-pyrenyl group, and of these, a 2-naphthyl group is particularly preferred industrially.

If X is an aromatic polycyclic hydrocarbon group, then the sensitivity is favorable, and the throughput is high, meaning the productivity can be improved.

Specific examples of preferred forms of the acid dissociable, dissolution inhibiting group (II) in the structural unit (a2) are shown below.

[Formula 3]

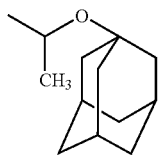
(II-a)

[Formula 4]

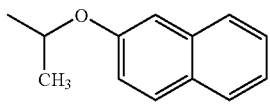
(II-b)

<Structural Unit (a3)>

The structural unit (a3) is a structural unit in which a hydroxyl group within the above general formula (I) has been protected by substituting the hydrogen atom thereof with an acyclic acid dissociable, dissolution inhibiting group (III).

In this description, the term "acyclic" means there are no cyclic structures within the acid dissociable, dissolution inhibiting group.

Examples of groups that can be used as the acyclic acid dissociable, dissolution inhibiting group (III) include the acyclic groups amongst those groups proposed as acid dissociable, dissolution inhibiting groups for use within the hydroxystyrene-based resins and (meth)acrylate-based resins and the like proposed as base resins for use within conventional chemically amplified KrF positive resist compositions and ArF positive resist compositions.

Examples of preferred acid dissociable, dissolution inhibiting groups (III) include chain-like tertiary alkoxycarbonyl groups, chain-like tertiary alkyl groups, chain-like alkoxyalkyl groups, and chain-like tertiary alkoxycarbonylalkyl groups. The number of carbon atoms within the chain-Like tertiary alkoxy group and/or chain-like tertiary alkyl group contained within this type of acid dissociable, dissolution inhibiting group (III) is preferably within a range from 4 to 10 in each case, and is even more preferably from 4 to 8. Furthermore, the total number of carbon atoms within the acid dissociable, dissolution inhibiting group (III) is preferably within a range from 4 to 10, and even more preferably from 4 to 8.

Specific examples of suitable chain-like tertiary alkoxycarbonyl groups include a tert-butoxycarbonyl group and tert-amyloxycarbonyl group.

Specific examples of suitable chain-like tertiary alkyl groups include a tert-butyl group and tert-amyl group.

Specific examples of suitable chain-like alkoxyalkyl groups include a 1-ethoxyethyl group, 1-methoxymethylethyl group, 1-isopropoxyethyl group, 1-methoxypropyl group, and 1-n-butoxyethyl group.

Specific examples of suitable chain-like tertiary alkoxycarbonylalkyl groups include a tert-butoxycarbonylmethyl group and tert-amyloxycarbonylmethyl group.

Of these, chain-like tertiary alkoxycarbonyl groups are preferred, and tert-butoxycarbonyl groups yield a particularly favorable resist pattern shape and are consequently the most desirable.

In a positive resist composition of the present invention, the proportion of the structural units (a1) within the component (A) relative to the combined total of all the structural units that constitute the component (A) is preferably within a range from 50 to 85 mol %, and even more preferably from 60 to 80 mol %. By ensuring that this proportion is at least as large as the lower limit of the above range, excellent alkali developability and favorable resolution can be achieved. Furthermore, ensuring that the proportion is no greater than the upper limit of the above range enables a favorable balance to be achieved with the other structural units.

Furthermore, the combined quantity of the structural units (a2) and the structural units (a3) within the component (A), relative to the combined total of all the structural units that constitute the component (A), is preferably within a range from 10 to 45 mol %, and even more preferably from 20 to 40 mol %. Provided this quantity is at least 10 mol %, the exposure margin for the positive resist composition of the present invention is extremely favorable. Furthermore, the resolution, and particularly the resolution of isolated line patterns, is also excellent. Provided the quantity is no more than 45 mol %, adequate solubility within alkali developing solutions can be obtained, defects are less likely, and a favorable level of sensitivity is obtained.

In the present invention, by ensuring that the component (A) includes these 3 structural units, a superior exposure margin can be obtained, and the resolution, and particularly the resolution during formation of so-called isolated line patterns in which the ratio of the size of the resist line portion relative to the size of the space portion is less than 1, such as a pattern in which the ratio of the size of the resist line portion relative to the size of the space portion is 1/9, can be improved. Moreover, excellent dry etching resistance is also obtained. In addition, not only is the level of pattern collapse of the resist pattern that occurs during developing reduced, but the shape of the resulting resist pattern also displays excellent rectangular formability.

A positive resist composition of the present invention also exhibits excellent dimensional controllability. This is because the positive resist composition of the present invention exhibits an excellent exposure margin, and is also capable of forming a resist film that shows little variation in performance under vacuum, that is, a resist film with enhanced stability under vacuum conditions. In other words, in the production of a conventional photomask, exposure of the resist film is typically conducted by direct patterning with an electron beam within a vacuum (for example, a pressure within a range from $1 \times 10^{-7}$ to $1 \times 10^{-5}$ Pa). However, in the case of exposure by direct patterning with an electron beam, increasing pattern miniaturization has meant that the time from commencement through to completion of patterning is considerable (for example, from approximately 12 to 24 hours). As a result, the time between exposure and post exposure baking (PEB) or developing differs, even across the surface of a single substrate, between those portions exposed first and those portions exposed last. Moreover, conventionally, the stability of resist films under vacuum is poor, and changes in the performance over time are large, meaning differences in the resist performance appear, and the pattern dimensions of those portions exposed first differ from the pattern dimensions of those portions exposed last, which is thought to result in a deterioration in the dimensional controllability. In contrast, a positive resist composition of the present invention exhibits excellent stability under vacuum and minimal changes in performance over time, meaning the dimensional controllability is good.

Furthermore, a positive resist composition is resistant to effects caused by the substrate material, and is able to form a rectangular pattern on all manner of substrates, including silicon wafers and anti-reflective films.

In a positive resist composition of the present invention, in addition to the structural units (a1) through (a3) described above, the component (A) may also include a structural unit (a4) represented by a general formula (IV) shown below.

[Formula 5]

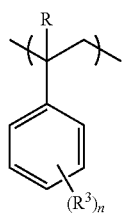

(IV)

(wherein, R represents a hydrogen atom or a methyl group, $R^3$ represents an alkyl group of 1 to 5 carbon atoms, and n represents either 0, or an integer from 1 to 3)

As mentioned above, R is either a hydrogen atom or a methyl group, although a hydrogen atom is preferred.

$R^3$ is a straight-chain or branched alkyl group of 1 to 5 carbon atoms, and suitable examples include a methyl group, ethyl group, propyl group, isopropyl group, n-butyl group, isobutyl group, tert-butyl group, pentyl group, isopentyl group, or neopentyl group. From an industrial viewpoint, a methyl group or ethyl group is preferred.

n is either 0, or an integer from 1 to 3. Of these possibilities, n is preferably either 0 or 1, and from an industrial viewpoint, is most preferably 0.

In those cases where n is from 1 to 3, the substitution position of the group $R^3$ may be the o-position, the m-position, or the p-position, and if n is 2 or 3, then any combination of substitution positions is suitable.

In the present invention, the structural unit (a4) is not essential, but including this structural unit enables the alkali solubility to be controlled by altering the quantity of the structural unit, and other benefits are also obtained, including a reduction in line edge roughness, and an ability to produce favorable isolated line patterns.

If the structural unit (a4) is used, then the proportion of these structural units (a4) relative to the combined total of all the structural units that constitute the component (A) is preferably within a range from 0.5 to 25 mol %, and even more preferably from 3 to 20 mol %. If the proportion of the structural units (a4) is greater than this range, then line edge roughness tends to increase, and favorable isolated line patterns tend to become more difficult to achieve.

In the present invention, the component (A) preferably contains a polymer (A1), which contains the structural unit (a1) and the structural unit (a2) but does not contain the structural unit (a3), and a polymer (A2), which contains the structural unit (a1) and the structural unit (a3) but does not contain the structural unit (a2). The reason for this preference is that including the structural unit (a2) and the structural unit (a3) in different polymers and then mixing the polymers to form a mixed resin enables preparation to be completed more easily than the case in which the structural unit (a2) and the structural unit (a3) are both included within the same polymer.

<Polymer (A1)>

Furthermore, the proportion of the structural units (a2) relative to the combined total of all the structural units that constitute the polymer (A1) is preferably within a range from 5 to 35 mol %, and is most preferably from 10 to 30 mol %. By ensuring that this proportion of the structural units (a2) is at least as large as the lower limit of the above range, the resolution and dry etching resistance can be improved, and favorable contrast can also be obtained. Furthermore, ensuring that the proportion is no greater than the upper limit of the above range yields a developing defect suppression effect.

As described below, in those cases where the polymer (A1) also includes the structural unit (a4), the proportion of the structural units (a2) relative to the combined total of all the structural units is preferably within a range from 5 to 35 mol %, and even more preferably from 10 to 20 mol %.

Furthermore, in those cases where the polymer (A1) contains no structural units (a4), the proportion of the structural units (a2) relative to the combined total of all the structural units is preferably within a range from 5 to 35 mol %, and even more preferably from 20 to 30 mol %.

Furthermore, in the polymer (A1), from the viewpoints of resolution and achieving a favorable balance with the structural units (a2), the proportion of the structural units (a1) relative to the combined total of all the structural units that constitute the polymer (A1) is preferably within a range from 50 to 90 mol %, and even more preferably from 60 to 85 mol %.

In a positive resist composition of the present invention, in addition to the structural units (a1) and (a2) described above, the polymer (A1) preferably also includes the structural unit (a4) represented by the aforementioned general formula (IV).

The weight average molecular weight (Mw, the polystyrene equivalent value, this also applies to all subsequent molecular weight values) of the polymer (A1) prior to protection with the acid dissociable, dissolution inhibiting groups is preferably within a range from 2,000 to 30,000, and even more preferably from 5,000 to 20,000. By ensuring the weight average molecular weight is no more than 30,000, the solubility in the resist solvent can be improved, whereas ensuring the value is at least 2,000 enables a favorable resist pattern shape to be obtained.

Furthermore, in terms of the polydispersity (the weight average molecular weight divided by the number average molecular weight (Mw/Mn), this also applies below) of the polymer (A1) prior to protection with the acid dissociable, dissolution inhibiting groups, a monodisperse polymer with a small polydispersity yields superior resolution and is consequently preferred. Specifically, the polydispersity is preferably no more than 2.0, and even more preferably 1.5 or less.

In a positive resist composition of the present invention, either a single polymer or a mixture of two or more different polymers may be used as the polymer (A1).

In those cases where a mixture of two or more different polymers is used as the polymer (A1), any two or more polymers selected from polymers (A1-1), which contain the structural units (a1) and (a2) but do not contain the structural units (a3) and (a4), and polymers (A1-2), which contain the structural units (a1), (a2) and (a4) but do not contain the structural units (a3), can be combined. The use of a mixture containing a polymer (A1-1) and a polymer (A1-2) is preferred. By using this type of mixture as the component (A), the shape of the resulting resist pattern displays favorable rectangular formability, and a superior isolated line pattern can be obtained.

<Polymer (A2)>

In the polymer (A2), the proportion of the aforementioned structural units (a3) relative to the combined total of all the structural units that constitute the polymer (A2) is preferably within a range from 30 to 50 mol %, and is even more preferably from 35 to 45 mol %. By ensuring that this proportion is at least as large as the lower limit of the above range, an excellent exposure margin is achieved, and the resolution, and particularly the resolution of isolated line patterns, can be improved. Furthermore, ensuring that the proportion is no greater than the upper limit of the above range yields a more favorable balance with the structural units (a1).

Furthermore, in the polymer (A2), from the viewpoints of resolution and achieving a favorable balance with the structural units (a3), the proportion of the structural units (a1) relative to the combined total of all the structural units that constitute the polymer (A2) is preferably within a range from 30 to 70 mol %, and even more preferably from 40 to 60 mol %.

The weight average molecular weight of the polymer (A2) prior to protection with the acid dissociable, dissolution inhibiting groups is preferably within a range from 2,000 to 30,000, and even more preferably from 5,000 to 20,000.

By ensuring this weight average molecular weight is no more than 30,000, the solubility in the resist solvent can be improved, whereas ensuring the value is at least 2,000 enables a favorable resist pattern shape to be obtained.

Furthermore, in terms of the polydispersity of the polymer (A2) prior to protection with the acid dissociable, dissolution inhibiting groups, a monodisperse polymer with a small polydispersity yields superior resolution and is consequently preferred. Specifically, the polydispersity is preferably no more than 2.0, and even more preferably 1.5 or less.

In a positive resist composition of the present invention, the polymer (A2) may be either a single polymer or a mixture of two or more different polymers.

In the component (A), the ratio (weight ratio) between the polymer (A1) and the polymer (A2) may be any blend ratio capable of satisfying the aforementioned protection ratio with the component (A). The ratio polymer (A1)/polymer (A2) is preferably within a range from 10/90 to 90/10, even more preferably from 50/50 to 90/20, and most preferably from 60/40 to 80/20. Ensuring that the ratio falls within the above range enables particularly superior manifestation of the effects of the present invention.

Furthermore, ratios in which polymer (A1)/polymer (A2)= 20/80 to 70/30 improve the stability of the composition under vacuum and enhance the dimensional controllability, and are consequently preferred.

Furthermore, in terms of maximizing the effects of the present invention, the combined quantity of the polymer (A1) and the polymer (A2) within the component (A) is preferably within a range from 50 to 100% by weight, and even more preferably from 70 to 100% by weight, and is most preferably 100% by weight, meaning that the component (A) is most preferably a mixed resin of the polymer (A1) and the polymer (A2).

The component (A) can be prepared by either a method in which a monomer corresponding with the structural unit (a1) is polymerized, and a portion of the hydroxyl groups of the structural units (a1) are then protected with the acid dissociable, dissolution inhibiting groups (II) and (III) using known techniques, or a method in which polymers (A1) and (A2) that have been protected with the acid dissociable, dissolution inhibiting groups (II) and (III) are first produced, and these polymers are then mixed together to generate a mixed resin.

Furthermore, the component (A) can also be produced by preparing monomers corresponding with the structural unit (a2) or (a3) in which a hydroxy group has already been protected with an acid dissociable, dissolution inhibiting group (II) or (III) respectively, subsequently polymerizing the monomers using normal methods, and then using hydrolysis to change a portion of the hydroxyl groups that have been protected with the acid dissociable, dissolution inhibiting groups back to hydroxyl groups.

[Acid Generator Component (B)]

In the present invention, as the acid generator component (B), a compound appropriately selected from known materials used as acid generators in conventional chemically amplified resists can be used.

Specific examples of suitable diazomethane-based acid generators include bis(isopropylsulfonyl)diazomethane, bis (p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Specific examples of suitable onium salts include diphenyliodonium trifluoromethanesulfonate, (4-methoxyphenyl) phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate, and triphenylsulfonium nonafluorobutanesulfonate. Of these, onium salts containing a fluorinated alkylsulfonate ion as an anion are preferred.

Specific examples of suitable oxime sulfonate compounds include α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfonyloxyimino)-p-bromophenylacetonitrile. Of these, α-(methylsulfonyloxyimino)-p-methoxyphenylacetonitrile is preferred.

As the component (B), either a single acid generator may be used alone, or a combination of two or more different acid generators may be used.

The quantity used of the component (B) is typically within a range from 1 to 20 parts by weight, and preferably from 2 to 10 parts by weight, per 100 parts by weight of the component (A). If the quantity is lower than the above range, then there is a danger that pattern formation may not progress satisfactorily, whereas if the quantity exceeds the above range it becomes difficult to achieve a uniform solution, and there is also a danger of a deterioration in the storage stability of the composition.

[Organic Solvent (C)]

A positive resist composition of the present invention can be produced by dissolving the materials in an organic solvent (C) (hereafter referred to as the component (C)).

The component (C) may be any solvent capable of dissolving each of the components used to generate a uniform solution, and one or more solvents selected from known materials used as the solvents for conventional chemically amplified resists can be used.

Suitable examples include γ-butyrolactone; ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents may be used either alone, or as a mixed solvent of two or more different solvents. The mixing ratio between propylene glycol monomethyl ether acetate (PGMEA) and a polar solvent can be determined on the basis of the co-solubility of the PGMEA and the polar solvent, but is preferably within a range from 1:9 to 8:2, and even more preferably from 2:8 to 5:5.

More specifically, in those cases where ethyl lactate (EL) is added as the polar solvent, the weight ratio of PGMEA:EL is preferably within a range from 2:8 to 5:5, and even more preferably from 3:7 to 4:6. Furthermore, as the organic solvent, a mixed solvent of at least one of PGMEA and EL, together with γ-butyrolactone is also preferred. In such cases, the mixing ratio is set so that the weight ratio between the former and latter components is preferably within a range from 70:30 to 95:5.

There are no particular restrictions on the quantity used of the component (C), which is set in accordance with the applied film thickness so as to produce a concentration that enables favorable application to a substrate or the like, and is typically sufficient to produce a solid fraction concentration within the resist composition of 2 to 20% by weight, and preferably from 5 to 15% by weight.

<Nitrogen-Containing Organic Compound (D)>

In order to improve the resist pattern shape and the post exposure stability of the latent image formed by the pattern-wise exposure of the resist layer, a nitrogen-containing organic compound can also be added to a positive resist composition of the present invention as an optional component (I)).

A multitude of these nitrogen-containing organic compounds have already been proposed, and any one of these known compounds can be used, although an amine, and particularly a secondary lower aliphatic amine or tertiary lower aliphatic amine is preferred. Specific examples include alkyl amines such as trimethylamine, diethylamine, triethylamine, di-n-propylamine, tri-n-propylamine, tripentylamine, tri-n-heptylamine, tri-n-octylamine, di-n-heptylamine, di-n-octyl amine, and tri-n-dodecylamine; and alkylalcohol anines such as diethanolamine, triethanolamine, diisopropanolamine, tri-isopropanolamine, di-n-octanolamine, and tri-n-octanolamine. Of these, secondary or tertiary aliphatic amines of 7 to 15 carbon atoms are preferred. By ensuring that the component contains 7 to 15 carbon atoms, the dispersion of the aliphatic amine through the formed resist pattern is suppressed, enabling a more uniform distribution. In the present invention, alkyl amines such as tri-n-octylamine are particularly preferred.

These compounds may be used either alone, or in combinations of two or more different compounds.

This component is typically used in a quantity within a range from 0.01 to 5.0 parts by weight per 100 parts by weight of the component (A).

Furthermore, in order to prevent any deterioration in sensitivity caused by the addition of the above component (D), and improve the resist pattern shape and the post exposure stability of the latent image formed by the pattern-wise exposure of the resist layer, an organic carboxylic acid, or a phosphorus oxo acid or derivative thereof can also be added as another optional component (E). The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

[Other Optional Components]

Other miscible additives can also be added to a positive resist composition of the present invention according to need, and examples include additive resins for improving the performance of the resist film, surfactants for improving the ease of application, dissolution inhibitors, plasticizers, stabilizers, colorants, and halation prevention agents.

[Method of Forming Resist Pattern]

A method of forming a resist pattern according to the present invention can be conducted, for example, in the manner described below.

Namely, a positive resist composition described above is first applied to the surface of a substrate such as a silicon wafer using a spinner or the like, a prebake is conducted under temperature conditions of 80 to 150° C. for 40 to 120 seconds, and preferably for 60 to 90 seconds, and the resulting film is then subjected to selective exposure through a desired mask pattern with either an electron beam or some other form of radiation such as far ultraviolet radiation, using an electron beam lithography apparatus or the like. In other words, following exposure through a mask pattern or patterning of the resist film by direct irradiation with an electron beam without using a mask pattern, PEB (post exposure baking) is conducted under temperature conditions of 80 to 150° C. for 40 to 120 seconds, and preferably for 60 to 90 seconds. Subsequently, developing is conducted using an alkali developing solution such as a 0.1 to 10% by weight aqueous solution of tetramethylammonium hydroxide. In this manner, a resist pattern that is faithful to the mask pattern can be obtained.

An organic or inorganic anti-reflective film may also be provided between the substrate and the applied layer of the resist composition.

There are no particular restrictions on the wavelength of the electron beam or other far ultraviolet radiation used for the exposure, and an ArF excimer laser, KrF excimer laser, $F_2$ excimer laser, or other radiation such as EUV (extreme ultraviolet), VUV (vacuum ultraviolet), EB (electron beam), X-ray or soft X-ray radiation can be used.

A photoresist composition according to the present invention exhibits superior etching resistance to conventional compositions, enables reductions in the thickness of the resist film, and prevents pattern collapse. Accordingly, the composition is ideally suited for microprocessing applications, and is particularly effective for use with an EB (electron beam).

Subsequently, the resist pattern obtained in the manner described above is typically used as a mask for conducting etching, thereby selectively removing those portions of the substrate or the like not covered by the resist. A resist composition of the present invention exhibits improved etching resistance, and is consequently ideal for this role.

As the dry etching method, conventional methods including chemical etching such as down-flow etching or chemical dry etching; physical etching such as sputter etching or ion beam etching; or chemical-physical etching such as RIE (reactive ion etching) can be used.

The most typical type of dry etching is parallel plate RIE. In this method, first, a resist laminate is placed inside the RIE apparatus chamber, and the required etching gas is introduced. A high frequency voltage is then applied within the chamber, between an upper electrode and the resist laminate holder which is positioned parallel to the electrode, and this causes the generation of a gas plasma. The plasma contains charged particles such as positive and negative ions and electrons, as well as electrically neutral active seeds. As these etching seeds adsorb to the lower resist layer, a chemical reaction occurs, and the resulting reaction product breaks away from the surface and is discharged externally, causing the etching to proceed.

EXAMPLES

As follows is a description of examples of the present invention, although the scope of the present invention is in no way limited by these examples.

Example 1

A resin (Mw=12,000, Mw/Mn=1.2) prepared by protecting 26% of the hydroxyl groups of a polyhydroxystyrene (Mw=8,000) with adamantoxyethyl groups, and a resin (Mw=12,400, Mw/Mn=1.2) prepared by protecting 44% of the hydroxyl groups of a polyhydroxystyrene (Mw=8,000) with t-butoxycarbonyl groups were mixed together in a ratio of 75/25 (weight ratio), and this mixed resin was then dissolved in propylene glycol monomethyl ether acetate, together with 6% by weight of triphenylsulfonium trifluoromethanesulfonate, 0.5% by weight of trioctylamine, 0.2% by weight of salicylic acid, and 0.05% by weight of the surfactant Megafac R-08 (manufactured by Dainippon Ink and Chemicals, Incorporated), with all these quantities calculated relative to the combined resin solid fraction, thus yielding a positive resist solution with a solid fraction concentration of 12% by weight.

This resist solution was applied uniformly, at a film thickness of 400 nm, to the surface of an 8-inch silicon substrate that had been treated with hexamethyldisilazane, and was then subjected to a bake treatment at 110° C. for 90 seconds to form a resist film.

The substrate was subjected to direct patterning using an electron beam lithography apparatus (HL-800D, manufactured by Hitachi, Ltd., accelerating voltage: 70 kV), and was then subjected to a bake treatment at 110° C. for 90 seconds, developed for 60 seconds in a 2.38% by weight aqueous solution of tetramethylammonium hydroxide (TMAH), and rinsed in pure water for 30 seconds, before the substrate was shaken dry and then further dried by heating at 100° C. for 60 seconds, thus forming a 1:1 line and space resist pattern and an isolated line pattern.

Inspection of the thus obtained resist pattern using a SEM revealed that the line and space pattern was resolved down to 100 nm.

Furthermore, the degree of dimensional variation per 1 $\mu C/cm^2$ across an exposure range that varies ±5% from the optimum exposure dose for a 200 nm line and space pattern was 12 nm [12 nm*($\mu C/cm^2$)], representing an exposure margin of 8%.

Furthermore, the isolated line pattern was resolved down to 100 nm.

Moreover, in both patterns, the shape of the resist pattern was rectangular and no pattern collapse was observed.

Subsequently, using the thus obtained resist pattern as a mask, etching was conducted using a mixed gas of oxygen and tetrafluoromethane as the etching gas, and a pattern was able to be formed in the substrate, indicating an excellent level of etching resistance for the resist.

Comparative Example 1

A resin (Mw=12,000, Mw/Mn=1.2) prepared by protecting 26% of the hydroxyl groups of a polyhydroxystyrene (Mw=8,000) with adamantoxyethyl groups was dissolved in propylene glycol monomethyl ether acetate, together with 6% by weight of triphenylsulfonium trifluoromethanesulfonate, 0.5% by weight of trioctylamine, 0.2% by weight of salicylic acid and 0.05% by weight of Megafac R-08 (manufactured by Dainippon Ink and Chemicals, Incorporated) relative to the solid fraction of the resin, thus yielding a positive resist solution with a solid fraction concentration of 12% by weight.

This resist solution was applied uniformly, at a film thickness of 400 nm, to the surface of an 8-inch silicon substrate that had been treated with hexamethyldisilazane, and was then subjected to a bake treatment at 110° C. for 90 seconds to form a resist film.

The substrate was subjected to direct patterning using an electron beam lithography apparatus (HL-800D, manufactured by Hitachi, Ltd., accelerating voltage: 70 kV), and was then subjected to a bake treatment at 110° C. for 90 seconds, developed for 60 seconds in a 2.38% by weight aqueous solution of tetramethylammonium hydroxide (TMAH), and rinsed in pure water for 30 seconds, before the substrate was shaken dry and then further dried by heating at 100° C. for 60 seconds, thus forming a 1:1 line and space resist pattern and an isolated line pattern.

Inspection of the thus obtained resist pattern using a SEM revealed that the line and space pattern was resolved down to 100 nm.

Furthermore, the degree of dimensional variation per 1 $\mu C/cm^2$ across an exposure range that varies ±5% from the optimum exposure dose for a 200 nm line and space pattern was 18 mm [18 mm/($\mu C/cm^2$)], representing an exposure margin of 5%.

Furthermore, the isolated line pattern was resolved down to 200 nm.

Although the line and space pattern was rectangular, the isolated line pattern was an inverted taper shape, and pattern collapse was observed at dimensions of 200 nm or lower.

In this manner, the resist pattern formed in the example 1 exhibited a large exposure margin and excellent resolution, and displayed particularly superior resolution in the formation of the isolated line pattern. In addition, the pattern shape was superior with a high degree of rectangularity, and no pattern collapse was observed. Furthermore, the resist also exhibited adequate dry etching resistance for conducting etching of the substrate.

Examples 2 to 5, Comparative Example 2, Examples 6 to 9, Comparative Example 3

100 parts by weight of a component (A) shown in Table 1 below, 8 parts by weight of α-(methylsulfonyloxyimino)-p- methoxyphenylacetonitrile as the component (B), 0.96 parts by weight of tri-n-octylamine as the component (D), 0.364 parts by weight of salicylic acid as the component (E), and 0.05 parts by weight of a surfactant XR-08 (a brand name, manufactured by Dainippon Ink and Chemicals, Incorporated) were dissolved in 1150 parts by weight of propylene glycol monomethyl ether acetate, thus yielding a positive resist composition solution.

Each of the thus obtained positive resist composition solutions was applied uniformly to the surface of a hexamethyldisilazane-treated 8-inch silicon substrate, in sufficient quantity to generate a resist film thickness shown below in Table 1, and was then subjected to a bake treatment (PAB) at 110° C. for 90 seconds to form a resist film. The substrate was then subjected to direct patterning using an electron beam lithography apparatus (HL-800D, manufactured by Hitachi, Ltd., accelerating voltage: 70 kV), and was then subjected to a bake treatment (PEB) at 110° C. for 90 seconds, developed for 60 seconds at 23° C. in a 2.38% by weight aqueous solution of TMAH, and rinsed in pure water for 30 seconds, before the substrate was shaken dry and then further dried by heating at 100° C. for 60 seconds, thus forming a resist pattern that was targeting a line and space pattern with a line width of 200 nm (line width/space width=1/1) (hereafter referred to as a 200 nm resist pattern).

The resulting resist pattern was then inspected using a scanning electron microscope (SEM), and the critical resolution (nm) at the optimum exposure dose for forming the 200 nm resist pattern was determined. This result is reported in Table 2 as the "resolution".

Furthermore, each of the thus obtained positive resist composition solutions was also applied uniformly to the surface of an 8-inch silicon substrate in sufficient quantity to generate a resist film thickness of 300 nm, and was subsequently subjected to a PAB treatment at 110° C. for 90 seconds to form a resist film, and the substrate was then placed inside an electron beam lithography apparatus (HL-800D, manufactured by Hitachi, Ltd., accelerating voltage: 70 kV) for a period from 0 hours to a maximum of 24 hours, and following direct patterning with the same exposure dose every two hours, the substrate was developed for 60 seconds at 23° C. in a 2.38% by weight aqueous solution of TMAH, rinsed in pure water for 30 seconds, shaken dry, and then further dried by heating at 100° C. for 60 seconds. In this manner, a plurality of 200 nm resist patterns which differed in terms of the delay time inside the lithography apparatus were formed on a single substrate. The pressure inside the lithography apparatus was $1.8 \times 10^{-5}$ Pa.

The degree of dimensional variation across the obtained 200 nm resist patterns was calculated in the manner described below. The results are shown in Table 2.

Degree of dimensional variation (nm)=line width that exhibits the largest degree of variation −200 nm (namely, of the formed resist patterns, the value obtained by subtracting 200 mm from the line width at the broadest portion of the line pattern, and the value obtained by subtracting 200 nm from the line width at the narrowest portion of the line pattern were compared, and the value that represented the larger absolute value was used)

In the Table 2, a + value indicates that the pattern is broader, whereas a − value indicates that the pattern is narrower.

TABLE 1

| | Component (A) [Blend quantities (parts by weight)] | | Resist film thickness (nm) |
|---|---|---|---|
| Example 2 | Resin 3 [80] | Resin 5 [20] | 300 |
| Example 3 | Resin 3 [70] | Resin 5 [30] | 300 |
| Example 4 | Resin 3 [60] | Resin 5 [40] | 300 |
| Example 5 | Resin 3 [20] | Resin 5 [80] | 300 |
| Comparative example 2 | Resin 3 [100] | — | 300 |
| Example 6 | Resin 4 [80] | Resin 5 [20] | 300 |
| Example 7 | Resin 4 [70] | Resin 5 [30] | 300 |
| Example 8 | Resin 4 [60] | Resin 5 [40] | 300 |
| Example 9 | Resin 4 [20] | Resin 5 [80] | 300 |
| Comparative example 3 | Resin 4 [100] | — | 300 |

The structures of the Resins 3 through 5 listed in Table 1 are as shown below.

[Formula 6]

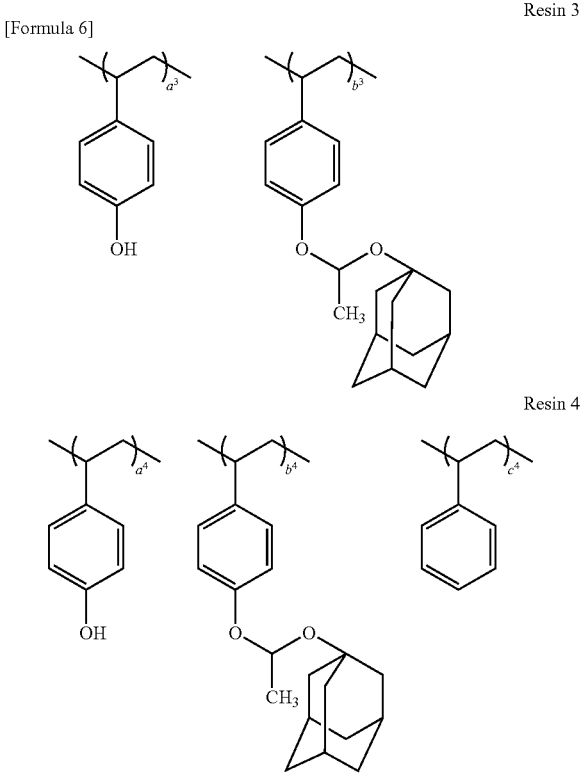

[wherein, the Resin 3 has a molar ratio $a^3:b^3=72:28$, Mw=12,000, and Mw/Mn=1.2; and the Resin 4 has a molar ratio $a^4:b^4:c^4=62:28:10$, Mw=10,000, and Mw/Mn=1.2]

[Formula 7]

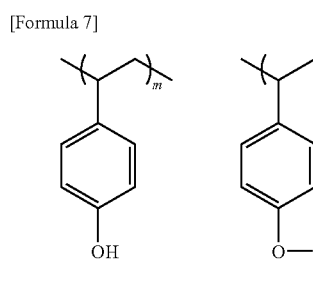
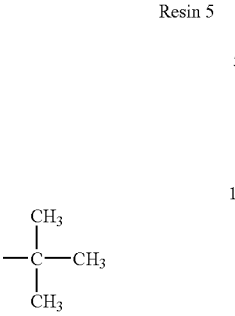

Resin 5

[wherein, m:n (molar ratio)=56:44, Mw=12,400, and Mw/Mn=1.2]

TABLE 2

|  | Resolution (nm) | Degree of dimensional variation (nm) |
| --- | --- | --- |
| Example 2 | 80 | −12.16 |
| Example 3 | 80 | −5.14 |
| Example 4 | 80 | −1.53 |
| Example 5 | 80 | +0.93 |
| Comparative example 2 | 80 | −20.13 |
| Example 6 | 80 | −9.83 |
| Example 7 | 80 | −4.16 |
| Example 8 | 80 | −1.53 |
| Example 9 | 80 | +2.38 |
| Comparative example 3 | 80 | −17.14 |

As is evident from the above results, all the examples 2 through 9 exhibited a high level of resolution of 80 nm. Furthermore, the degree of dimensional variation was also small, indicating compositions with excellent dimensional controllability. These results confirm that the positive resist compositions of the examples 2 through 9 exhibit excellent stability under vacuum. Of these compositions, the results for the examples 3 through 5 and the examples 7 through 9, in which the Resin 3 or 4, and the Resin 5 were used in a ratio (weight ratio) within a range from 20/80 to 70/30, were particularly superior.

In contrast, although the positive resist compositions of the comparative examples 2 and 3 exhibited a high level of resolution, the degree of dimensional variation was large, indicating poor stability under vacuum.

The invention claimed is:

1. A positive resist composition, comprising a resin component (A), which contains acid dissociable, dissolution inhibiting groups and displays increased alkali solubility under action of acid, and an acid generator component (B) that generates acid on exposure, wherein said resin component (A) comprises a structural unit (a1) represented by a general formula (I) shown below:

[Formula 1]

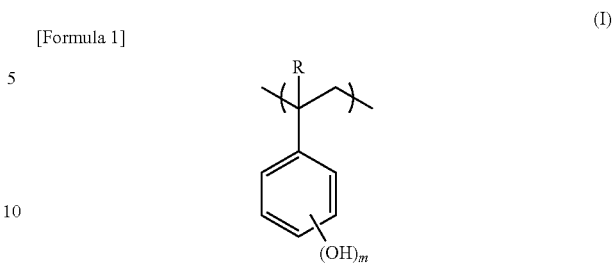

(wherein, R represents a hydrogen atom or methyl group, and m represents an integer from 1 to 3), a structural unit (a2) in which a hydroxyl group of said general formula (I) has been protected by substituting a hydrogen atom thereof with an acid dissociable, dissolution inhibiting group (II) represented by a general formula (II) shown below:

[Formula 2]

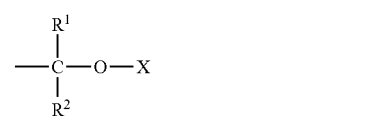

(wherein, $R^1$ represents an alkyl group of 1 to 5 carbon atoms, $R^2$ represents an alkyl group of 1 to 5 carbon atoms or a hydrogen atom, and X represents an unsubstituted adamantyl group), and a structural unit (a3) in which a hydroxyl group of said general formula (I) has been protected by substituting a hydrogen atom thereof with an acyclic acid dissociable, dissolution inhibiting group (III), wherein said acid dissociable, dissolution inhibiting group (III) is a chain-like tertiary alkoxycarbonyl group, and wherein said resin component (A) comprises a polymer (A1), which contains said structural unit (a1) and said structural unit (a2) but does not contain said structural unit (a3), and a polymer (A2), which contains said structural unit (a1) and said structural unit (a3) but does not contain said structural unit (a2).

2. A positive resist composition according to claim 1, wherein a combined quantity of said structural units (a2) and said structural units (a3), relative to a combined total of all structural units that constitute said resin component (A), is within a range from 10 to 45 mol %.

3. A positive resist composition according to claim 1, wherein said acid dissociable, dissolution inhibiting group (III) is a tert-butoxycarbonyl group.

4. A positive resist composition according to claim 1, wherein said R is a hydrogen atom.

5. A positive resist composition according to claim 1, wherein in said resin component (A), a ratio (weight ratio) between said polymer (A1) and said polymer (A2) is within a range from 50/50 to 90/20.

6. A positive resist composition according to claim 1, wherein in said resin component (A), a ratio (weight ratio) between said polymer (A1) and said polymer (A2) is within a range from 20/80 to 70/30.

7. A positive resist composition according to claim 1, wherein a proportion of said structural units (a3), relative to a combined total of all structural units that constitute said polymer (A2), is within a range from 30 to 50 mol %.

8. A positive resist composition according to claim 1, wherein a proportion of said structural units (a2), relative to a combined total of all structural units that constitute said polymer (A1), is within a range from 5 to 35 mol %.

9. A positive resist composition according to claim 1, wherein a weight average molecular weight of said polymer (A1), prior to protection with said acid dissociable, dissolution inhibiting groups (II), is within a range from 2,000 to 30,000.

10. A positive resist composition according to claim 1, wherein a polydispersity of said polymer (A1), prior to protection with said acid dissociable, dissolution inhibiting groups (II), is no more than 2.0.

11. A positive resist composition according to claim 1, wherein said acid generator component (B) is an onium salt comprising a fluorinated alkylsulfonate ion as an anion.

12. A positive resist composition according to claim 1, further comprising a nitrogen-containing organic compound (D).

13. A positive resist composition according to claim 1, which can be used in a method of forming a resist pattern comprising an exposure step that uses an electron beam.

14. A method of forming a resist pattern, comprising the steps of applying a positive resist composition according to claim 1 to a substrate, conducting a prebake, performing selective exposure, and then conducting post exposure baking (PEB), and performing alkali developing to form a resist pattern.

* * * * *